United States Patent
Crandall et al.

(10) Patent No.: US 8,487,893 B2
(45) Date of Patent: Jul. 16, 2013

(54) AUTOMATIC GAIN CONTROL FOR CAPACITIVE TOUCH PANEL SENSING SYSTEM

(75) Inventors: Kenneth Crandall, Sunnyvale, CA (US); Michael Brosnan, Fremont, CA (US); Jeffrey Stone, Fort Collins, CO (US); Thomas Murphy, Boulder Creek, CA (US)

(73) Assignee: Pixart Imaging, Inc., Hsin-Chu (TW)

( * ) Notice: Subject to any disclaimer, the term of this patent is extended or adjusted under 35 U.S.C. 154(b) by 322 days.

(21) Appl. No.: 13/108,968

(22) Filed: May 16, 2011

(65) Prior Publication Data

US 2012/0293446 A1  Nov. 22, 2012

(51) Int. Cl.
*G06F 3/041* (2006.01)

(52) U.S. Cl.
USPC .......................................... 345/173; 178/18.06

(58) Field of Classification Search
None
See application file for complete search history.

(56) References Cited

U.S. PATENT DOCUMENTS

| | | | |
|---|---|---|---|
| 6,424,338 B1 | 7/2002 | Anderson | |
| 7,525,050 B1 * | 4/2009 | Weaver et al. | 178/18.04 |
| 8,094,128 B2 * | 1/2012 | Vu et al. | 345/173 |
| 2007/0080940 A1 * | 4/2007 | Aoki et al. | 345/158 |
| 2009/0032312 A1 | 2/2009 | Huang et al. | |
| 2009/0127003 A1 | 5/2009 | Geaghan | |
| 2009/0267905 A1 | 10/2009 | Hsu et al. | |
| 2010/0085325 A1 | 4/2010 | King-Smith et al. | |
| 2011/0210941 A1 * | 9/2011 | Reynolds et al. | 345/174 |

OTHER PUBLICATIONS

Preliminary Product Data Sheet, "AMRI-5200 Low-Power 10-Touch Controller," Apr. 20, 2011, Avago Technologies.

\* cited by examiner

*Primary Examiner* — Adam R Giesy
*Assistant Examiner* — Emily Frank
(74) *Attorney, Agent, or Firm* — McClure, Qualey & Rodack, LLP (57) ABSTRACT

Disclosed are capacitive touchscreen or touch panel systems, devices and methods which increase the dynamic range of touches that may be detected on a capacitive touch screen or touch panel. Increased dynamic range is provided by employing automatic gain control methodologies and circuitry to process signals corresponding to individual mutual capacitance cells in a touch screen or touch panel.

18 Claims, 5 Drawing Sheets

FIG. 7

# AUTOMATIC GAIN CONTROL FOR CAPACITIVE TOUCH PANEL SENSING SYSTEM

FIELD

Various embodiments described herein relate to the field of touchscreen or touchpad systems, devices, components and methods configured to detect touches on a touchscreen or touch panel using capacitive sensing techniques.

BACKGROUND

Capacitive touch panel sensors include touchscreens or touch panels comprising arrays of sensing cells. Touches cause capacitance change at the cell or cells underlying the region being touched. The touchscreen controller detects and locates the capacitance changes by analyzing signals generated by the cells due to capacitance change, the signals undergoing analog amplification and filtering followed by digitization and subsequent digital signal processing. The primary result of the analysis is the determination of the affected cell position and hence, the corresponding touch location.

However, the cells in any given array may vary widely in their capacitance values. This intrinsic variation, combined with variation in the characteristics of analog amplification components, power supply variations and other factors can cause the signal amplitudes output by the cells to vary through a dynamic range of up to 20 dB. Such a large variation complicates the determination of touch position. Approaches such as applying a global signal threshold to distinguish between touch and no-touch states have been discovered to be of limited value.

What is needed is a touchscreen system, and method of operating such a system, that can equalize the effective gain of each individual cell of a touch panel sensor without causing deterioration in the sensor's ability to track touches of interest.

SUMMARY

According to one embodiment, there is provided a capacitive touchscreen or touch panel system comprising a touchscreen comprising a first plurality of electrically conductive drive electrodes arranged in rows or columns, and a second plurality of electrically conductive sense electrodes arranged in rows or columns arranged at an angle with respect to the rows or columns of the first plurality of electrodes, mutual capacitances existing between the first and second pluralities of electrodes at locations where the first and second pluralities of electrodes intersect to form individual cells, the mutual capacitances changing in the presence of one or more fingers of a user or touch devices brought into proximity thereto, drive circuitry operably connected to the first plurality of drive electrodes, sense circuitry operably connected to the second plurality of sense electrodes and configured to sense input signals corresponding to the individual cells therefrom, and a controller operably connected to the first plurality of drive electrodes and the second plurality of sense electrodes, the controller comprising a central processing unit (CPU) and automatic level control (ALC) circuitry comprising at least one scaler and decimator circuit configured to receive signals corresponding to the individual cells and to provide therefrom scaled and decimated output signals corresponding to such individual cells, a multiplier circuit operably connected to the scaler and decimator circuit and configured to receive the scaled and decimated output signals therefrom, and further to multiply such scaled and decimated output signals by a gain factor and to provide multiplier output signals therefrom, a first subtractor circuit operably connected to the multiplier circuit and configured to receive the multiplier output signals therefrom and to subtract a predetermined set point value from such multiplier output signals thereby to provide error output signals therefrom, an ALC control loop filter circuit operably connected to the CPU and the multiplier circuit and configured to calculate updated gain factors based on the error output signals and to provide such updated gain factors to the multiplier circuit, and a second subtractor circuit configured to subtract multiplied output signals from a desired set point value and to provide final output signals corresponding thereto to the CPU, wherein the CPU is configured to calculate touch position data based on the final output signals corresponding to the positions of the one or more fingers of the user or touch devices.

According to another embodiment, there is provided method of detecting touches on a capacitive touchscreen or touch panel system, the system comprising a touchscreen comprising a first plurality of electrically conductive drive electrodes arranged in rows or columns, and a second plurality of electrically conductive sense electrodes arranged in rows or columns arranged at an angle with respect to the rows or columns of the first plurality of electrodes, mutual capacitances existing between the first and second pluralities of electrodes at locations where the first and second pluralities of electrodes intersect to form individual cells, the mutual capacitances changing in the presence of one or more fingers of a user or touch devices brought into proximity thereto, drive circuitry operably connected to the first plurality of drive electrodes, sense circuitry operably connected to the second plurality of sense electrodes and configured to sense input signals corresponding to the individual cells therefrom, and a controller operably connected to the first plurality of drive electrodes and the second plurality of sense electrodes, the controller comprising a central processing unit (CPU) and automatic level control (ALC) circuitry, the method comprising scaling and decimating signals corresponding to the individual cells to provide scaled and decimated output signals corresponding to the individual cells, multiplying the scaled and decimated output signals by a gain factor to provide multiplied output signals, subtracting the multiplied output signals from a predetermined set point value to provide error output signals, calculating updated gain factors based on the error output signals, subtracting multiplied output signals from a desired set point value and providing final output signals corresponding thereto, and calculating touch position data based on the final output signals that correspond to the positions of the one or more fingers of the user or touch devices.

Further embodiments are disclosed herein or will become apparent to those skilled in the art after having read and understood the specification and drawings hereof.

BRIEF DESCRIPTION OF THE DRAWINGS

Different aspects of the various embodiments will become apparent from the following specification, drawings and claims in which:

The drawings are not necessarily to scale. Like numbers refer to like parts or steps throughout the drawings.

DETAILED DESCRIPTIONS OF SOME EMBODIMENTS

Figure 1:
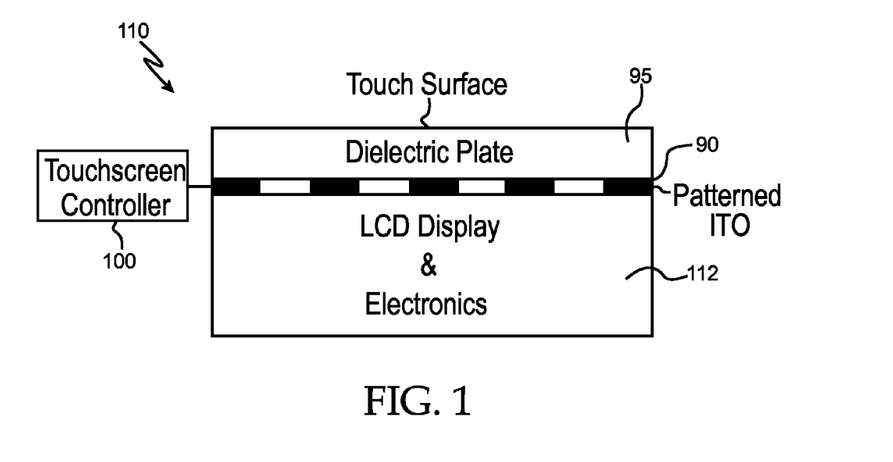
FIG. 1 shows a cross-sectional view of one embodiment of a capacitive touchscreen system.

As illustrated in FIG. 1, a capacitive touchscreen system 110 typically consists of an underlying LCD or OLED display 112, an overlying touch-sensitive panel or touchscreen 90, a protective cover or dielectric plate 95 disposed over the touchscreen 90, and a touchscreen controller, micro-processor, application specific integrated circuit ("ASIC") or CPU 100. Note that image displays other than LCDs or OLEDs may be disposed beneath touchscreen 90.

Figure 2:
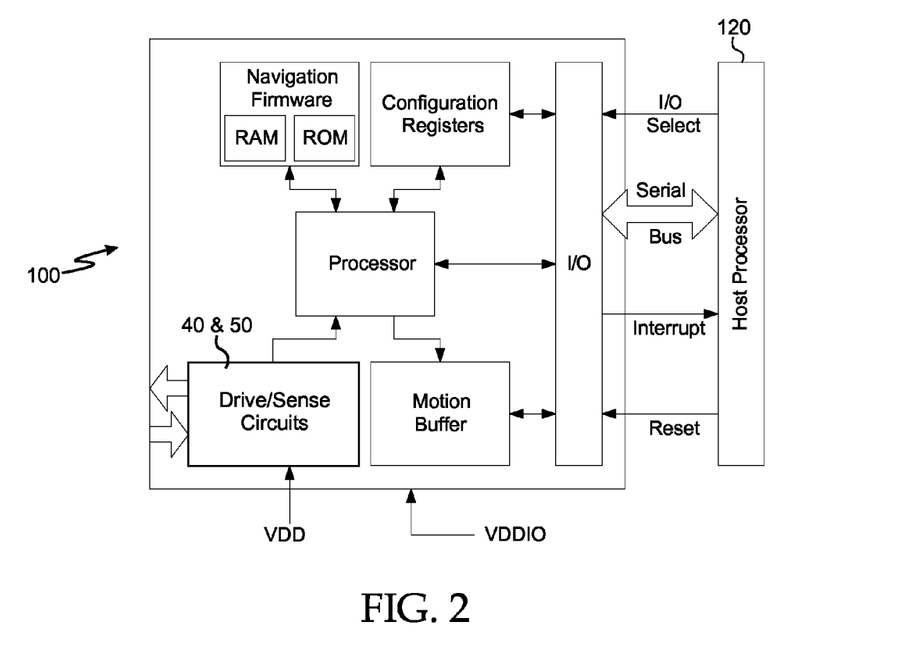
FIG. 2 shows a block diagram of a capacitive touchscreen controller.

FIG. 2 shows a block diagram of one embodiment of a touchscreen controller 100. In one embodiment, touchscreen controller 100 may be an Avago Technologies™ AMRI-5000 ASIC or chip 100 modified in accordance with the teachings presented herein. In one embodiment, touchscreen controller is a low-power capacitive touch-panel controller designed to provide a touchscreen system with high-accuracy, on-screen navigation.

Figure 3:
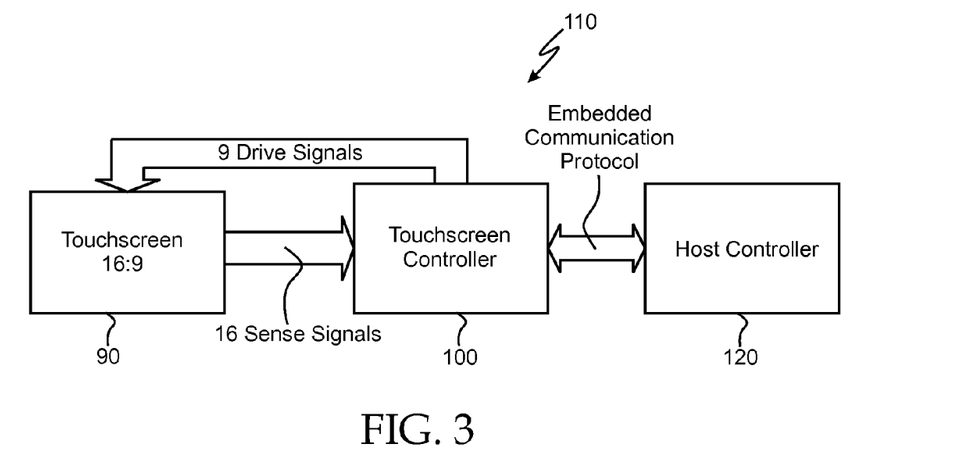
FIG. 3 shows one embodiment of a block diagram of a capacitive touchscreen system and a host controller.
Figure 4:
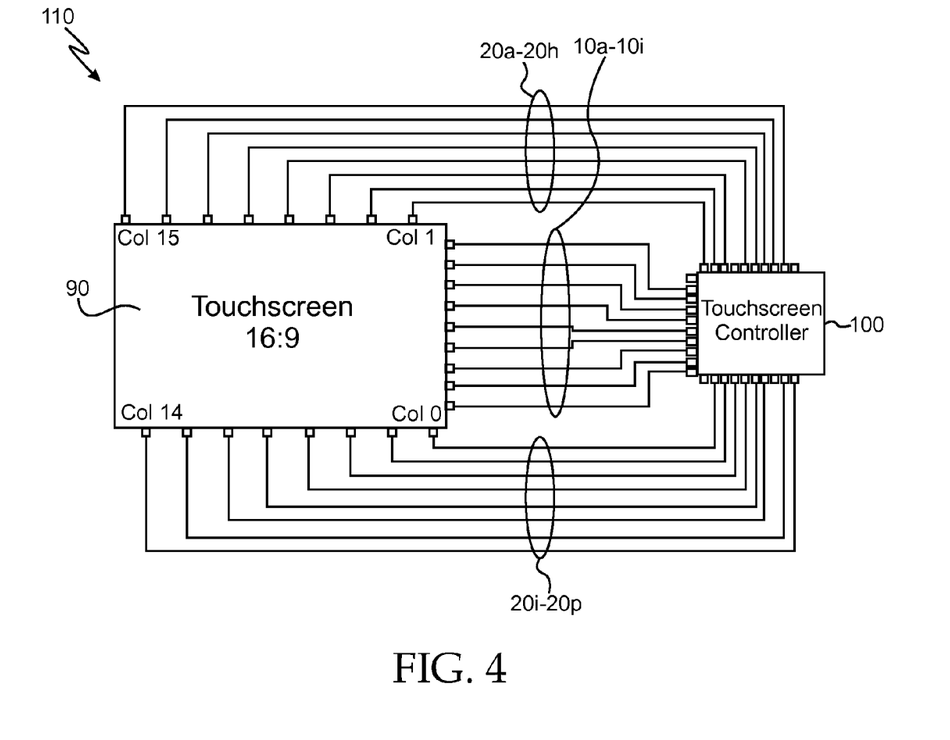
FIG. 4 shows a schematic block diagram of one embodiment of a capacitive touchscreen system.

Capacitive touchscreens or touch panels 90 shown in FIGS. 3 and 4 can be formed by applying a conductive material such as Indium Tin Oxide (ITO) to the surface(s) of a dielectric plate, which typically comprises glass, plastic or another suitable electrically insulative and preferably optically transmissive material, and which is usually configured in the shape of an electrode grid. The capacitance of the grid holds an electrical charge, and touching the panel with a finger presents a circuit path to the user's body, which causes a change in the capacitance.

Touchscreen controller 100 senses and analyzes the coordinates of these changes in capacitance. When touchscreen 90 is affixed to a display with a graphical user interface, on-screen navigation is possible by tracking the touch coordinates. Often it is necessary to detect multiple touches. The size of the grid is driven by the desired resolution of the touches. Typically there is an additional cover plate 95 to protect the top ITO layer of touchscreen 90 to form a complete touch screen solution (see, e.g., FIG. 1).

One way to create a touchscreen 90 is to apply an ITO grid on one side only of a dielectric plate or substrate. When the touchscreen 90 is mated with a display there is no need for an additional protective cover. This has the benefit of creating a thinner display system with improved transmissivity (>90%), enabling brighter and lighter handheld devices. Applications for touchscreen controller 100 include, but are not limited to, smart phones, portable media players, mobile internet devices (MIDs), and GPS devices.

Referring now to FIGS. 3 and 4, in one embodiment the touchscreen controller 100 includes an analog front end with 9 drive signal lines and 16 sense lines connected to an ITO grid on a touchscreen. Touchscreen controller 100 applies an excitation such as a square wave, meander signal or other suitable type of drive signal to the drive electrodes that may have a frequency selected from a range between about 40 kHz and about 200 kHz. The AC signal is coupled to the sense lines via mutual capacitance. Touching touchscreen or touch panel 90 with a finger alters the capacitance at the location of the touch. Touchscreen controller 100 can resolve and track multiple touches simultaneously. A high refresh rate allows the host to track rapid touches and any additional movements without appreciable delay. The embedded processor filters the data, identifies the touch coordinates and reports them to the host. The embedded firmware can be updated via patch loading. Other numbers of drive and sense lines are of course contemplated, such as 8×12 and 12×20 arrays.

Touchscreen controller 100 may feature multiple operating modes with varying levels of power consumption. For example, in rest mode controller 100 may periodically look for touches at a rate programmed by the rest rate registers. There are multiple rest modes, each with successively lower power consumption. In the absence of a touch for a certain interval controller 100 may automatically shift to the next-lowest power consumption mode. However, as power consumption is reduced the response time to touches may increases.

According to one embodiment, and as shown in FIG. 4, an ITO grid or other electrode configuration on touchscreen 90 comprises sense columns 20a-20p and drive rows 10a-10i, where sense columns 20a-20p are operably connected to corresponding sense circuits and rows 10a-10i are operably connected to corresponding drive circuits. One configuration for routing ITO or other lines from drive and sense electrodes to lines to touchscreen controller 100 is shown in FIG. 4.

Those skilled in the art will understand that touchscreen controllers, micro-processors, ASICs or CPUs other than a modified AMRI-5000 chip or touchscreen controller 100 may be employed in touchscreen system 110, and that different numbers of drive and sense lines, and different numbers and configurations of drive and sense electrodes, other than those explicitly shown herein may be employed without departing from the scope or spirit of the various embodiments disclosed herein.

Figure 5:
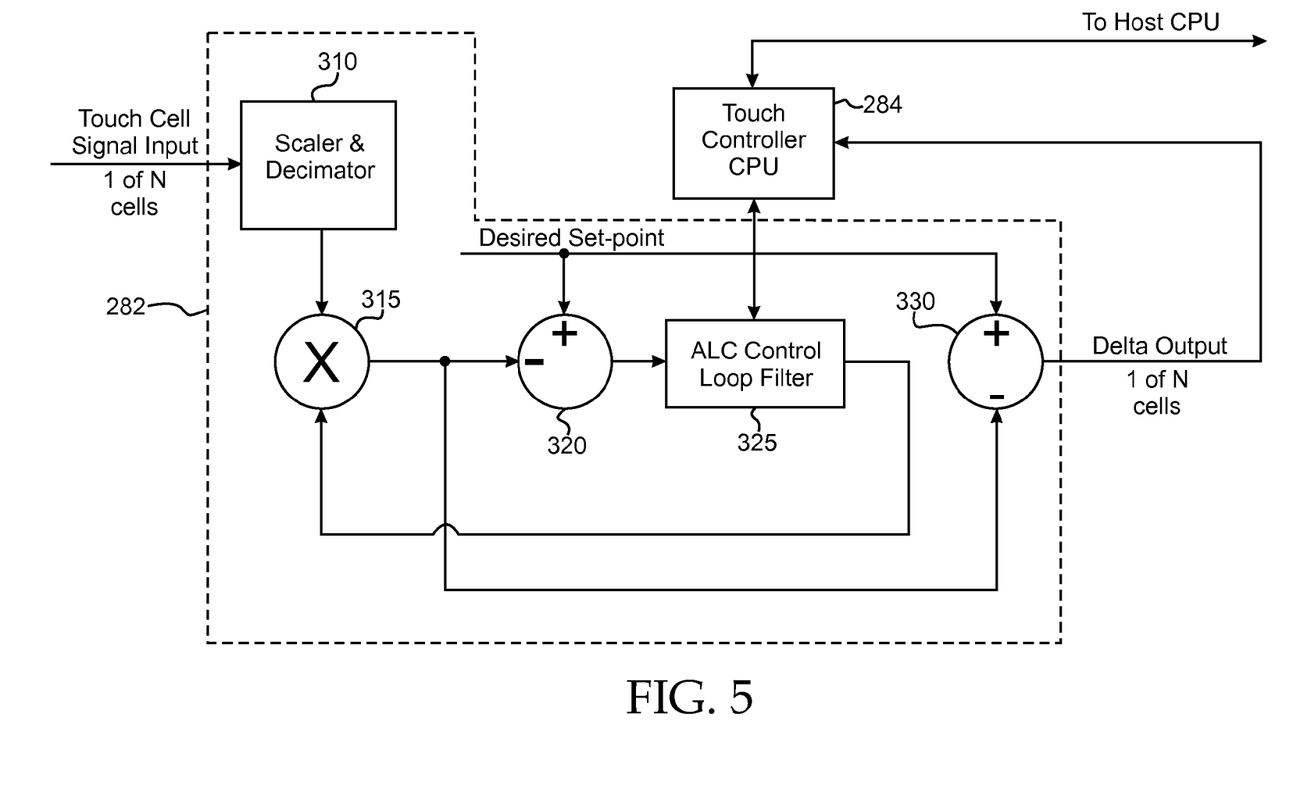
FIG. 5 shows a schematic block diagram of one embodiment of a touchscreen system including automatic gain control.

FIG. 5 shows a schematic diagram of one embodiment of a touchscreen system 110 designed to minimize the effect of cell-to-cell variation using automatic level control (ALC) circuitry 282. Each ALC circuit 282 adaptively adjusts the gain of a corresponding individual cell of the touch panel sensor, with the effect that the cell outputs across the array are leveled out to have the same "no touch" value.

The signal input from each of the N capacitive cells of the sensor panel, where N is typically of the order of hundreds or thousands of cells, is received by scaler and decimator stage or circuit 310 of a corresponding ALC circuit 282. Stage 310 scales and decimates (reduces the sample rate for) the input signal. The scale factor and decimation factors are implementation dependent and set the final sample accuracy and maximum bandwidth. The next stage of ALC 282 is a multiplier 315 that controls the gain of the cell signal. This constitutes the "plant" in an integral control loop.

The output of multiplier circuit 315 proceeds along two separate paths. One path is the control loop path passing through elements 320, 325 and back to 315. The other path passes through subtractor 330.

Control Loop Path

The control loop calculates an error signal defined as the difference between the "Plant Output" (the output of multiplier 282, fed into a negative port of element 320) and a "Desired Set Point" (applied to the positive port of element 320) as follows:

$$\text{Error} = \text{Desired Set-point} - \text{Plant Output} \quad (1)$$

where the Desired Set Point is a fixed number that represents the desired plant output for cells that are not being touched.

The error output signal calculated by element 320 as described by equation (1) is fed to ALC control loop filter circuit 325, which includes an integrator with controllable front-end gain. The error signal is gain-controlled by using a shift register in front of the integrator. If smaller gains are applied to the error signal, narrower loop bandwidth results, with correspondingly longer adaptation time constants. The loop gain is controlled by firmware (associated with CPU 284). The output of the integrator within 325 is fed back to multiplier circuit 315 to control the plant gain. Negative feedback drives the plant gain in the direction that minimizes the error signal.

The control loop filter circuit may be configured to operate in either of two modes, which are characterized by long and short time constants respectively, and which correspond to slow and fast operation, with low and high loop bandwidths. System controller 100 acting through CPU 284 configures the filter to have a long time constant when the system firmware detects a touch, indicated by the cell capacitance signal dropping below a predetermined threshold. The long time constant (low loop bandwidth) is required so that the finger touch does not get "tracked out" by the ALC if the user's finger remains in contact with the sensor for several seconds.

System controller 100 acting through CPU 284 configures the filter to have a short time constant when no touch is detected. This permits rapid adjustment to assure proper trim of the "no-touch" signal gain. Accurate no-touch gain trim allows all cells to have the same effective gain, and controller 100 to use the same threshold value for all cells to achieve precise touch detection.

Subtractor Path

The subtractor stage removes the set-point offset in the signal output from multiplier 315 as shown in equation (2):

$$\text{Delta Output} = \text{Set-point} - \text{Plant Output} \quad (2)$$

The calculated Delta Output normally rests at zero when no touches are detected. If the delta output is positive, that positive value is compared with a threshold value to determine if touch contact at the corresponding cell position can be assumed.

The Delta Output itself can be compensated for gain variations by a table look-up method. This may be particularly useful for panels with variable thickness covers, causing the delta signal to be lower for cells under thicker sections of panel. The table look-up can be performed in hardware or firmware. The contents of the table are determined by the characteristics of panel 90, and this process is open loop controlled.

Touch controller CPU 284 and associated firmware perform ALC initialization, ALC loop bandwidth adjustment, touch threshold detection, and, optionally, delta gain compensation. Controller CPU 284 finally outputs the determined touch navigation data of interest to a host processor.

Figure 6:
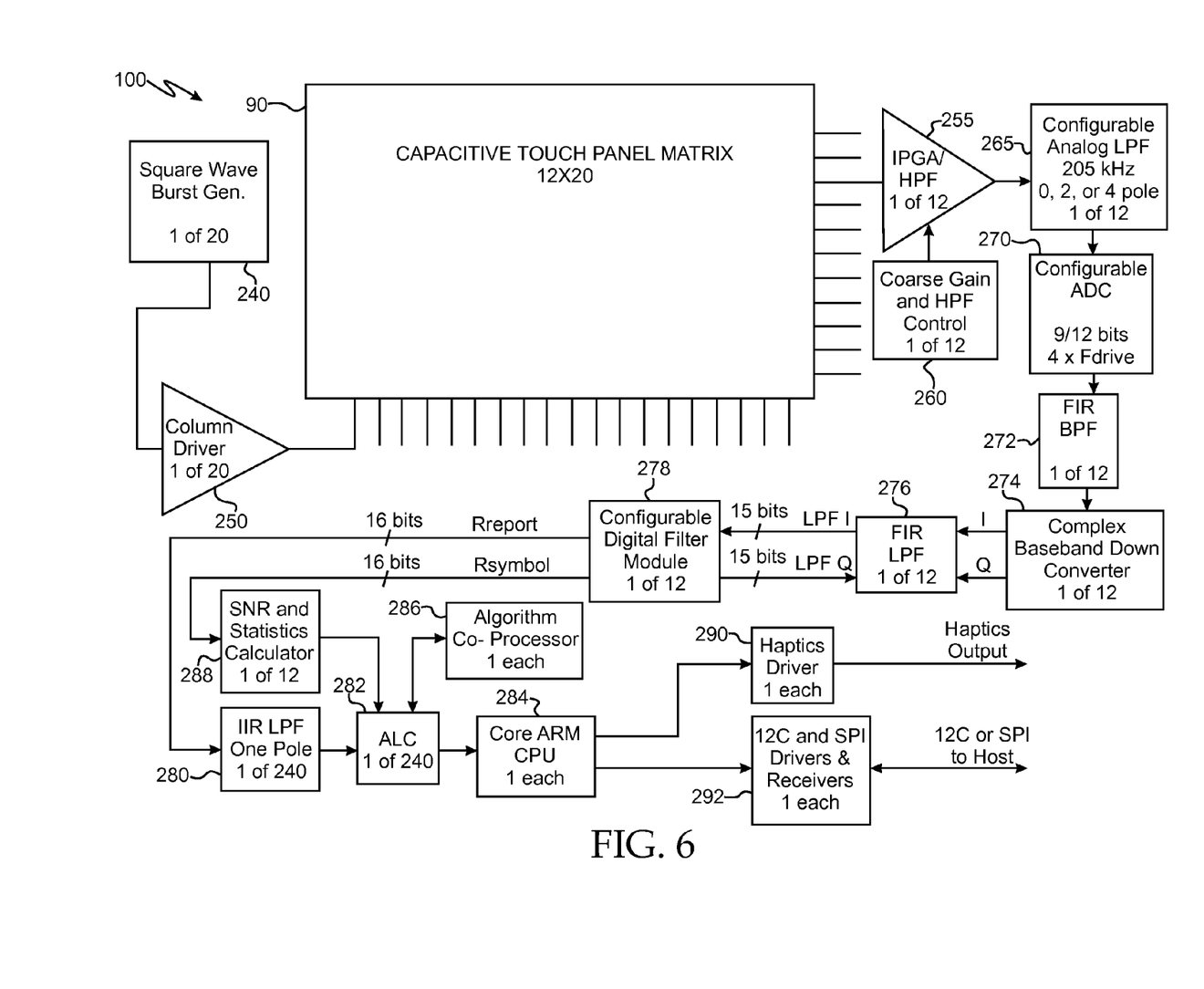
FIG. 6 shows a schematic block diagram of one embodiment of a touch screen controller.

FIG. 6 shows a schematic diagram of one embodiment of a touch screen controller ASIC 100 with a touchscreen or touch panel matrix 90 using 240 touch cells arranged in a grid of 12×20 cells.

A typical mutual-capacitance measurement technique senses capacitive changes on the touch panel matrix or touchscreen 90 by measuring the capacitive coupling between the driver signals, supplied by square wave burst generators 240 through column drivers 250, and the corresponding signals output from the sense Integrating Programmable Gain Amplifier (IPGA) pins shown on the right hand side of touch panel matrix 90. It should be noted that although only one generator 240 and one driver 250 are shown explicitly in the figure, other configurations are also contemplated, such as one for each column or row of the array. The sensed signals are amplified and high pass filtered by amplifier elements 255 controlled by coarse gain and analog filter control elements 260. The gain-adjusted, high-pass-filtered signals are low-pass-filtered by analog filters 265, and then digitized by configurable ADCs 270 before they are filtered by FIR band pass filters 272 and down-converted by complex baseband down-converters 274. Down-converters 274 output parallel I and Q data streams, which are fed first into FIR low pass filters 276 and then into configurable digital filter modules 278.

Outputs from the configurable digital filter modules 278 are filtered by one pole IIR low pass filters 280 and leveled by passage through ALCs automatic level control circuits 282 before being input to ARM core processor 284. Outputs from the configurable digital filter modules 278 also pass through SNR and statistics calculator 288 before reaching processor 284.

Navigation-related processing is then carried out by the combination of CPU or ARM core processor 284 and algorithm coprocessor 286, providing haptic outputs from haptic driver 290 to host controller 120, and exchanging SPI or TWI data through I2C and SPC driver/receiver interface 292 with host controller 120.

It should be noted that although only one each of amplifier element 255, control element 260, low-pass filter 265, ADC 270, FIR BPF 272, down-converter 274, FIR low pass filter 276, digital filter module 278, IIR low pass filter 280, ALC circuit 282 and CPU 284 are shown, other configurations of such and other components are contemplated, such as one set for each row or column of array 90.

In the specific embodiment shown in FIG. 6, there is one IIR low pass filter 280 and one ALC circuit 282 for each of the two hundred and forty cells of array 90, those cells being arranged in a grid of 12×20. The capacitors are scanned using 20 row drivers and 12 sense amplifiers. Each cell appears as a capacitor with a nominal value of 2 pF that reduces in value when touched to around 1.8 pF. Each signal determined by that capacitance value is sampled and processed so that it is presented to ALC circuit 282 as a digital value in the range of 5000 to 50000.

ALC circuit 282 uses a feedback control loop to normalize the signal representing cell capacitance with respect to a numerical value of 16384. There are 240 such ALC loops, one for each cell. The value of 16384 is arbitrary and represents the set-point of the control loop corresponding with a cell that is not touched. Since only changes in capacitance are of interest, the final output is obtained by subtracting the touch signal from 16384 to create a positive delta value when a cell is touched, that touch causing the capacitance value to be significantly reduced from its untouched state. Delta values range from 2000 to 5000 when a cell is touched, depending on panel and finger characteristics. A threshold is set by firmware to establish when a touch has occurred.

The integral control loop implementing ALC operation may be clocked in discrete time intervals, with the filtered touch cell signal being sampled on each clock interval. In one particular implementation of touch screen controller ASIC 100 shown in FIG. 6, the firmware adjustable clock rate is nominally 150 Hz. The input samples are 16 bit unsigned twos complement numbers. These numbers correspond to touch cell capacitance values. ALC 282 contains a 29 bit integrator register that contains the gain value. This number is multiplied by the 16 bit input to gain control the input.

According to one embodiment, the governing equations for a specific implementation are as follows:

$$\text{cellError} = 16384 - \text{floor}(\text{cellIIRout}[t] * \text{cellIntegrator}[t-1]/33554432) \quad (3)$$

$$\text{cellIntegrator}[t] = \text{cellIntegrator}[t-1] + \text{floor}(\text{cellError} * 33554432/Ki) \quad (4)$$

where $Ki=2^{k1}$ for cellError>0, and $Ki=2^{k2}$ for cellError<0
and k1 and k2 range from 10, 11, 12, ... 25

$$\text{cellDeltaOut}[t] = \text{floor}((\text{cellDeltaCal}/4096)*(16384 - \text{floor}(\text{cellIIRout}[t]*\text{cellIntegrator}[t]/33554432))) \quad (5)$$

where:
cellIntegrator: 29 bit unsigned integer, 1 of 240 (firmware R/W and freeze)
cellIIRout: 16 bit unsigned integer output of IIR filter, 1 of 240
Ki: integration loop gain, based on k1 and k2
k1: 5 bit unsigned integer touch loop gain exponent global variable (firmware R/W)
k2: 5 bit unsigned integer anti-touch gain exponent global variable (firmware R/W)
cellDeltaCal: 16 bit unsigned integer, default value is 4096 for unity gain, 1 of 240 (firmware R/W)
cellDeltaOut: 16 bit signed integer corresponding with touch delta, 1 of 240 (firmware R/W)

The integrator numerically adds its value to the cell error value to obtain an updated integrator value. The integrator (cellIntegrator) is multiplied by the input value (cellIIRout). The product is scaled by a right shift 25 (i.e. divide by 33554432). This number is the gain adjusted cell value. An error value is created by subtracting it from the set-point of 16384. The error value is scaled by Ki and then drives the integrator. The Ki value controls the loop bandwidth. Larger Ki values increase the bandwidth and correspondingly reduce the response time of the loop.

The delta output (cellDeltaOut) is computed by subtraction from the set-point and final scaling by a tabulated factor (cellDeltaCal). The final processed normalized cell value is then used by navigation firmware to track touch location and intensity.

Figure 7:
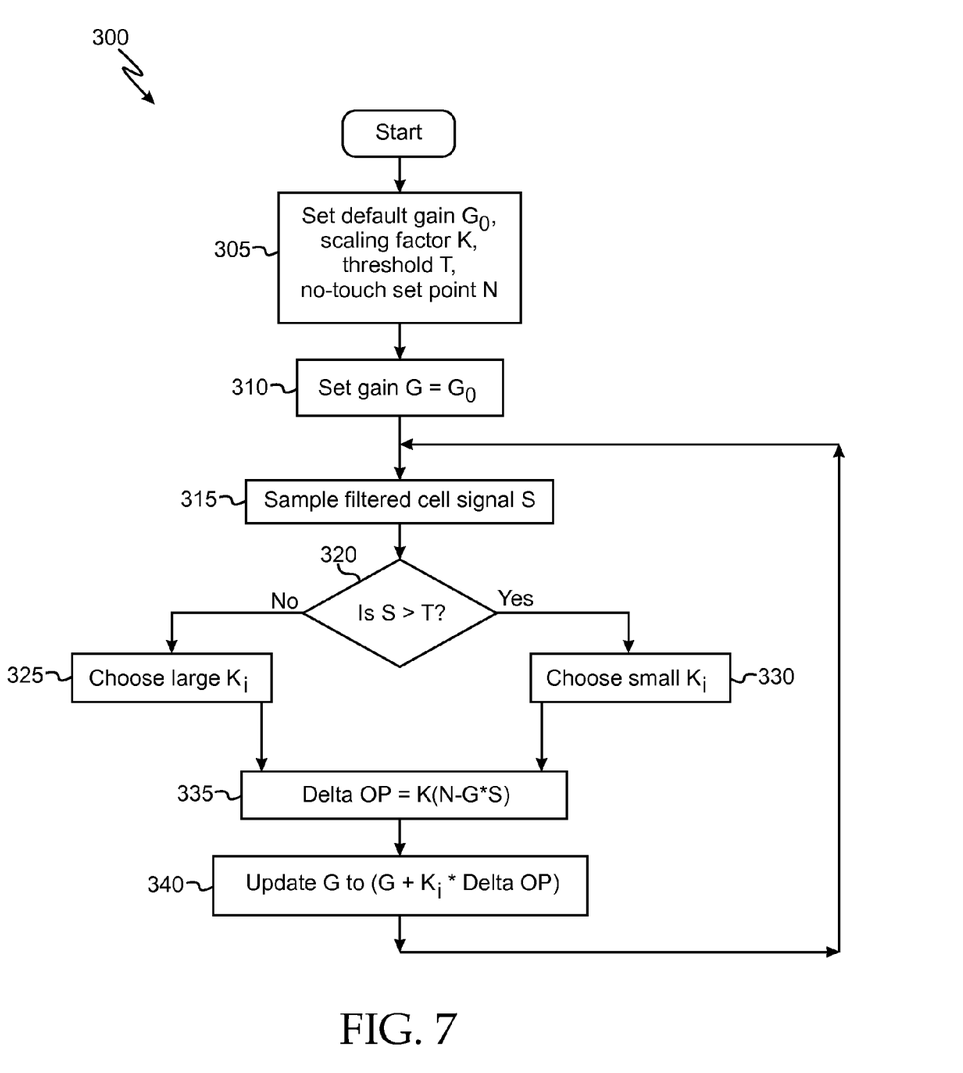
FIG. 7 shows a flowchart for one embodiment of a method for controlling a touchscreen system that employs automatic gain control.

The value of Ki is of key importance to the successful normalization of capacitor cells. The sign of the error causes the selection of two possible gain values. Capacitor values above nominal (called anti-touch) must be quickly tracked out by k2. Capacitor values below nominal (normal touches) are more slowly tracked out by k1. In addition, the value of k1 depends on whether a touch is sensed. A touch sense (delta threshold exceeded) changes k1 to a much lower value to slow down cell gain adjustment so that a touch is not tracked out by the loop. This variable gain process permits all cells to look alike with touches not perturbing the necessary fine gain trim FIG. 7 shows one method 400 for controlling a touchscreen system employing automatic gain control. The method, which is carried out for each individual cell, begins at step 305 by setting values for default gain, scaling factor, threshold for touch detection, and no-touch set point. At step 310, the loop gain is set to the default value. At step 315, the filtered output signal from the cell is sampled. The method determines at step 320 whether the cell output signal is larger than the set threshold. If the signal is larger than the threshold value, indicating that a true touch has occurred, the method goes to step 330 at which a small value of the loop bandwidth factor Ki is chosen, but If the signal S is smaller than the threshold value, indicating that no touch has occurred, the method goes to step 335 at which a large value of the loop bandwidth factor Ki is chosen.

After either step 325 or step 330, the method continues on to step 335, where the Delta Output is calculated in terms of the scaling factor, no-touch set point, gain, and signal. Finally the value of gain is updated at step 340 by the addition of the product of loop bandwidth factor and the Delta Output and the method returns to step 315 to sample an individual cell signal.

Such a method allows the gain of each individual cell to be equalized with multiplicative adaptive correction, and also adaptively controls loop bandwidth to facilitate tracking variations in cell gain while ignoring touch activity.

Note that much of the circuitry and many of the components, elements, devices and methods disclosed herein are employed in the Avago Technologies® AMRI-5200 touchscreen controller. A Preliminary Product Data Sheet for the AMRI-5200 touchscreen controller dated Apr. 20, 2011 and entitled "AMRI-5200 Low-Power 10-Touch Controller," filed on even date herewith in a corresponding Information Disclosure Statement and corresponding USPTO Form 1449, is hereby incorporated by reference herein in its entirety.

Various embodiments are contemplated in addition to those disclosed hereinabove. The above-described embodiments should be considered as examples, rather than as limiting the scope of the various embodiments. In addition to the foregoing embodiments, review of the detailed description and accompanying drawings will show that there are other embodiments. Accordingly, many combinations, permutations, variations and modifications of the foregoing embodiments not set forth explicitly herein will nevertheless fall within the scope of the invention.

We claim:

1. A capacitive touchscreen or touch panel system, comprising:
    a touchscreen comprising a first plurality of electrically conductive drive electrodes arranged in rows or columns, and a second plurality of electrically conductive sense electrodes arranged in rows or columns arranged at an angle with respect to the rows or columns of the first plurality of electrodes, mutual capacitances existing between the first and second pluralities of electrodes at locations where the first and second pluralities of electrodes intersect to form individual cells, the mutual capacitances changing in the presence of one or more fingers of a user or touch devices brought into proximity thereto;
    drive circuitry operably connected to the first plurality of drive electrodes;
    sense circuitry operably connected to the second plurality of sense electrodes and configured to sense input signals corresponding to the individual cells therefrom, and
    a controller operably connected to the first plurality of drive electrodes and the second plurality of sense electrodes, the controller comprising a central processing unit (CPU) and automatic level control (ALC) circuitry comprising:
        at least one scaler and decimator circuit configured to receive signals corresponding to the individual cells and to provide therefrom scaled and decimated output signals corresponding to such individual cells;
        a multiplier circuit operably connected to the scaler and decimator circuit and configured to receive the scaled and decimated output signals therefrom, and further to multiply such scaled and decimated output signals by a gain factor and to provide multiplier output signals therefrom;
        a first subtractor circuit operably connected to the multiplier circuit and configured to receive the multiplier output signals therefrom and to subtract a predetermined set point value from such multiplier output signals thereby to provide error output signals therefrom;

an ALC control loop filter circuit operably connected to the CPU and the multiplier circuit and configured to calculate updated gain factors based on the error output signals and to provide such updated gain factors to the multiplier circuit, and a second subtractor circuit configured to subtract multiplied output signals from a desired set point value and to provide final output signals corresponding thereto to the CPU;

wherein the CPU is configured to calculate touch position data based on the final output signals corresponding to the positions of the one or more fingers of the user or touch devices.

2. The system of claim 1, wherein the CPU is further configured to provide the touch position data to a host controller.

3. The system of claim 1, wherein the ALC control loop filter circuit comprises a shift register and an integrator.

4. The system of claim 1, wherein the ALC control loop filter circuit is further configured to provide a gain factor that when fed back to the multiplier minimizes the error signals.

5. The system of claim 1, wherein the controller is configured to cause the ALC control loop filter circuit to have a short time constant when no touch is detected by the system.

6. The system of claim 1, wherein the controller is configured to cause the ALC control loop filter circuit to have a long time constant when a touch is detected by the system.

7. The system of claim 6, wherein touch detection is determined by individual cell capacitances dropping below a predetermined threshold.

8. The system of claim 7, further comprising system firmware configured to determine touch detection.

9. The system of claim 1, wherein the controller comprises ALC circuitry for each of N individual cells of the touchscreen.

10. The system of claim 1, wherein each of the N ALC circuits uses the same predetermined set point value.

11. The system of claim 1, wherein the signals corresponding to the individual cells are digitized filtered output signals.

12. The system of claim 1, wherein the digitized filtered output signals have digital values ranging between about 5000 and 50000.

13. The system of claim 1, wherein the predetermined set point value ranges between about 16,000 and about 20,000.

14. A method of detecting touches on a capacitive touchscreen or touch panel system, the system comprising a touchscreen comprising a first plurality of electrically conductive drive electrodes arranged in rows or columns, and a second plurality of electrically conductive sense electrodes arranged in rows or columns arranged at an angle with respect to the rows or columns of the first plurality of electrodes, mutual capacitances existing between the first and second pluralities of electrodes at locations where the first and second pluralities of electrodes intersect to form individual cells, the mutual capacitances changing in the presence of one or more fingers of a user or touch devices brought into proximity thereto, drive circuitry operably connected to the first plurality of drive electrodes, sense circuitry operably connected to the second plurality of sense electrodes and configured to sense input signals corresponding to the individual cells therefrom, and a controller operably connected to the first plurality of drive electrodes and the second plurality of sense electrodes, the controller comprising a central processing unit (CPU) and automatic level control (ALC) circuitry, the method comprising:

scaling and decimating signals corresponding to the individual cells to provide scaled and decimated output signals corresponding to the individual cells;

multiplying the scaled and decimated output signals by a gain factor to provide multiplied output signals;

subtracting the multiplied output signals from a predetermined set point value to provide error output signals;

calculating updated gain factors based on the error output signals;

subtracting multiplied output signals from a desired set point value and providing final output signals corresponding thereto, and calculating touch position data based on the final output signals that correspond to the positions of the one or more fingers of the user or touch devices.

15. The method of claim 14, further comprising providing touch position data to a host controller.

16. The method of claim 14, further comprising calculating and providing feedback gain factors to minimize the error output signals.

17. The method of claim 14, further comprising detecting touches when individual cell capacitances drop below a predetermined threshold.

18. The method of claim 14, further comprising employing system firmware to detect touches.

* * * * *